United States Patent [19]

Izumi et al.

[11] Patent Number: 5,113,788
[45] Date of Patent: May 19, 1992

[54] SCREEN PRINTING MACHINE FOR THROUGH HOLE PRINTING AN ELECTRIC CONDUCTOR

[75] Inventors: Yasuo Izumi, Ikoma; Syoji Sato, Neyagawa; Kazumi Ishimoto, Katano; Yutaka Makino, Kobe; Shohzo Ueno, Kofu, all of Japan

[73] Assignee: Matsushita Electric Industrial Co., Ltd., Osaka, Japan

[21] Appl. No.: 571,096

[22] Filed: Aug. 21, 1990

[30] Foreign Application Priority Data

Aug. 22, 1989 [JP] Japan ................... 1-216450

[51] Int. Cl.⁵ .................. B05D 5/12; B05C 11/00
[52] U.S. Cl. .................. 118/663; 427/97
[58] Field of Search .......... 427/97, 238, 294, 282; 118/663, 710, 50, 213, 214, 215, 254; 101/126, 129, 123; 137/14, 487.5

[56] References Cited

U.S. PATENT DOCUMENTS

| | | | |
|---|---|---|---|
| 4,417,312 | 11/1983 | Cronin et al. | 137/487.5 X |
| 4,690,163 | 9/1987 | Steinemann | 137/14 X |
| 4,710,395 | 12/1987 | Young et al. | 427/97 X |
| 4,959,246 | 9/1990 | Cleemput | 427/294 X |
| 4,981,074 | 1/1991 | Machita et al. | 101/126 X |

FOREIGN PATENT DOCUMENTS 3509626 9/1986 Fed. Rep. of Germany ........ 427/97

Primary Examiner—Clifford D. Crowder
Attorney, Agent, or Firm—Wenderoth, Lind & Ponack

[57] ABSTRACT

A screen printing machine has a table on which a substrate is to be put, a substrate adjusting device on the table to adjust the position of the substrate on the table, a screen plate capable of being placed on the table, a squeegee movable on the plate, a suction unit connected with the table to apply suction to the substrate through through holes of the substrate, a measuring device arranged in the suction unit to measure the degree of vacuum in the suction unit, and an adjusting device arranged in the suction unit to adjust the degree of vacuum.

6 Claims, 8 Drawing Sheets

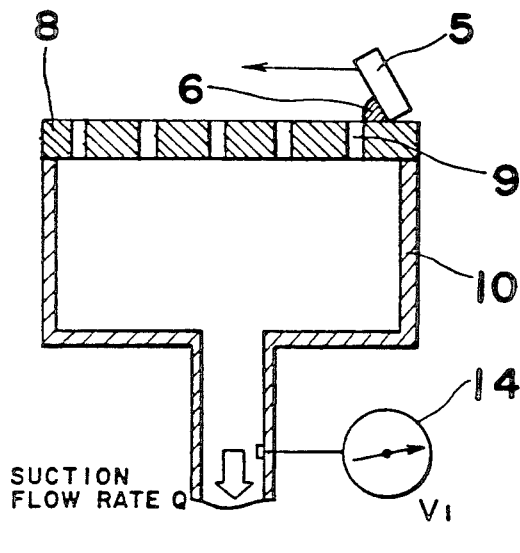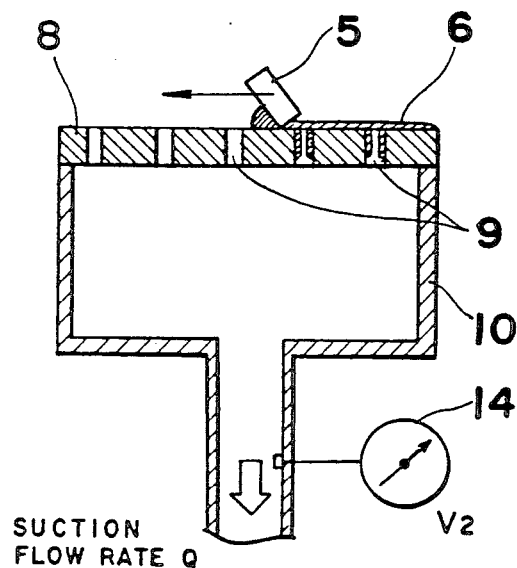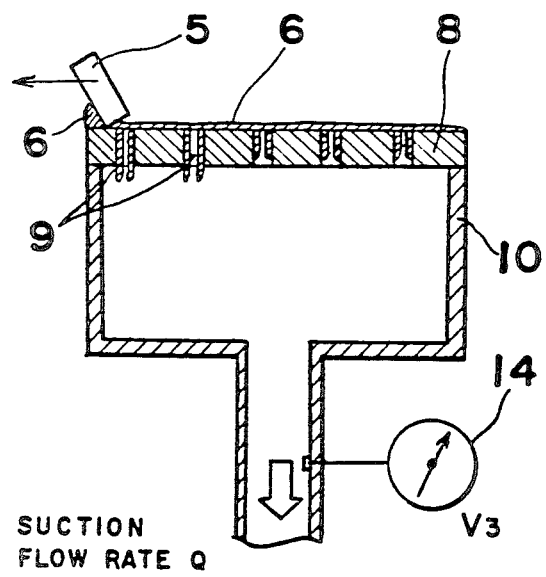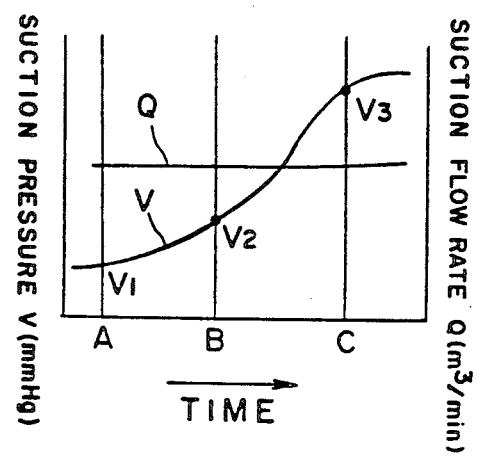

SCREEN PRINTING MACHINE FOR THROUGH HOLE PRINTING AN ELECTRIC CONDUCTOR

BACKGROUND OF THE INVENTION

The present invention relates to a screen printing machine for performing a through hole printing to print an electric conductor onto the surface of a substrate and the inner surface of a through hole formed in the substrate.

Recently, it has become important to develop high-density packaging techniques to provide electronic equipment with more functions. Specially, in order to effectively utilize the limited surface area of a substrate, one method is employed in which electronic parts are mounted on the upper and lower surfaces of the substrate so that some parts mounted on the upper and lower surfaces are electrically short-circuited. A through hole printing method for printing an electric conductor onto the inner surfaces of through holes formed in the substrate is employed as one of the methods for short-circuiting the parts. The through hole printing method is so arranged that suction is exerted through the through holes previously formed in the substrate in printing the electric conductor onto the surface of the substrate to print and attach the conductor onto the inner surfaces of the through holes. At this time, it is necessary to adjust the suction condition in accordance with the position, number, and size of the through holes of the substrate. Therefore, conventionally, a known machine for adjusting the suction condition is, as shown in FIG. 4, so constructed that two kinds of suction conduits 30a and 30b, that is, a suction conduit 30a for a low flow rate and a suction conduit 30b for a high flow rate, with respective manual throttle valves 31a and 31b, are provided between a flow meter 19 and a changeover valve 32 to change the conduits 30a and 30b by the valve 32. Furthermore, in FIG. 4, reference numeral 2 denotes a table, 3 a substrate position adjusting member arranged on the table 2, 4 a screen plate capable of being lowered onto the table 2, 5 a squeegee movable on the plate 4, 6 paste, 8 a substrate to be put on the table 2 to be printed, 9 through holes previously formed in the substrate 8, 10 a suction unit under the table 2, 11 support pins in the suction unit 10, 19 a flow meter connected with the suction unit 10 through a pipe 35, 25 a changeover valve for changing between conduits 23 and 24, 26 a pipe, and 27 a blower functioning as a suction source by producing vacuum. The changeover valves 32 and 25 are connected with each other through the conduit 24. In the machine, the change-over valve 32 changes between the conduits 30a and 30b in accordance with the position, number, and size of the through holes of the substrate so as to adjust the suction condition.

However, in the machine, it is necessary to provide several kinds of suction conduits for one suction unit, resulting in complex construction. When the suction conduits 30a and 30b are changed over by the changeover valve 32, the suction flow rate is immediately changed, resulting in rapid change of the degree of vacuum in the suction unit which has an adverse effect on the through hole printing.

Additionally, when the screen printing is performed on the substrate, the substrate is accurately positioned with respect to a screen plate and then paste previously supplied on the plate is transmitted through the plate by movement of the squeegee to coat the paste onto the surface of the substrate and the inner surfaces of the through holes. Thus, in this through hole printing method, it is necessary to simultaneously perform the coating and the suction operations.

In this case, the total cross-sectional area of the holes at the time the through hole printing is first performed differs from the cross-sectional area at the time the printing is last performed because of the paste printed on the substrate. Thus, when the suction operation is performed at a constant flow rate (Q), as shown in FIGS. 5A-5D, the degree of vacuum is lower at the start of the printing, so that it is difficult to sufficiently suck paste through the through holes. The degree of vacuum is gradually increased as the total cross-sectional area of the through holes is reduced due to the paste adhering to the walls thereof, and then the degree of vacuum reaches a specified value which may remove the paste adhered to the inner surfaces of the through holes from the inner surfaces by the suction, resulting in lower reliability of the printing.

As shown in FIGS. 6A-6D, in order to overcome these disadvantages, it is recognized by the inventors that it is necessary to delicately adjust the degree of vacuum by the adjustment of the suction flow rate so that the through holes firstly printed and those lastly printed will be uniformly printed.

SUMMARY OF THE INVENTION

Accordingly, an essential object of the present invention is to provide a screen printing machine capable of quantitatively controlling the conditions, which change from moment to moment, for printing an electric conductor onto the inner surface of a through hole previously formed in a substrate and easily corresponding to the position, number, and size of the through holes in the substrate which change in accordance with the change of the type of substrate.

In accomplishing these and other objects, according to one aspect of the present invention, there is provided a screen printing machine comprising: a table on which a substrate is to be put; a substrate adjusting member on the table to adjust the position of the substrate on the table; a screen plate capable of being placed on the table; a squeegee movable on the plate; a suction unit connected with the table to exert suction on the substrate through the through holes of the substrate; a measuring means in the suction unit to measure the degree of vacuum in the suction unit; and an adjusting means in the suction unit to adjust the degree of vacuum.

According to the above construction of the present invention, the measuring means is attached to the suction unit to measure and output the degree of vacuum in the suction unit during a printing operation and the degree of vacuum is adjusted by the adjusting means. Therefore, the degree of vacuum can be delicately adjusted by the adjusting means so that the through hole first printed and that last printed will have the same printed coating as each other, resulting in stable through hole printing.

In another aspect of the present invention, there is provided a screen printing machine in which the adjusting means is a throttle valve driven to open and close by a servomotor or a pulse motor.

According to this construction, the throttle valve is drive by an actuator the position of which is detectable, such as a servomotor or a pulse motor, so that the degree of opening of the valve is controlled by the position of the actuator based on the degree of vacuum measured by the measuring means, that is, the suction flow rate is adjusted to change the suction condition for stable through hole printing.

In a still another aspect of the present invention, there is provided a screen printing machine further comprising a control means for judging that a printing state with respect to the substrate is abnormal when the degree of vacuum measured by the measuring means in the suction unit differs from a predetermined degree of vacuum by a specified value in performing a through hole printing to print an electric conductor onto a surface of the substrate and inner surfaces of the through holes, and then outputting instructions to check the printing state of the substrate.

According to this construction, when the degree of vacuum measured by the measuring means differs from the predetermined vacuum degree by the specified value, it is judged by the control means that the printing state is abnormal and then the controller outputs instructions to check the printing state. Therefore, the conditions, which changes from moment to moment, for printing the electric conductor onto the inner surfaces of the through holes of the substrate can be controlled quantitatively.

In a further aspect of the present invention, there is provided a screen printing machine further comprising: a recognition camera for recognizing the position of the substrate with respect to the table and positions, number, and sizes of the through holes; and another control means for calculating and setting a suction condition suitable for the through holes on the basis of the results obtained by the camera, and thus performing the through hole printing.

According to this construction, the machine can easily be set to operate to correspond to the positions, number, and sizes of the through holes of the substrate recognized by the camera in accordance with the change of the type of substrate.

BRIEF DESCRIPTION OF THE DRAWINGS

These and other objects and features of the present invention will become clear from the following description of the preferred embodiments thereof with reference to the accompanying drawings, in which:

FIGS. 5A–5C are cross-sectional views showing states of the screen printing operation for a constant suction flow rate;

FIG. 5D is a view showing the correlation between the suction pressure and the suction flow rate;

DETAILED DESCRIPTION OF THE EMBODIMENTS

Figure 1:
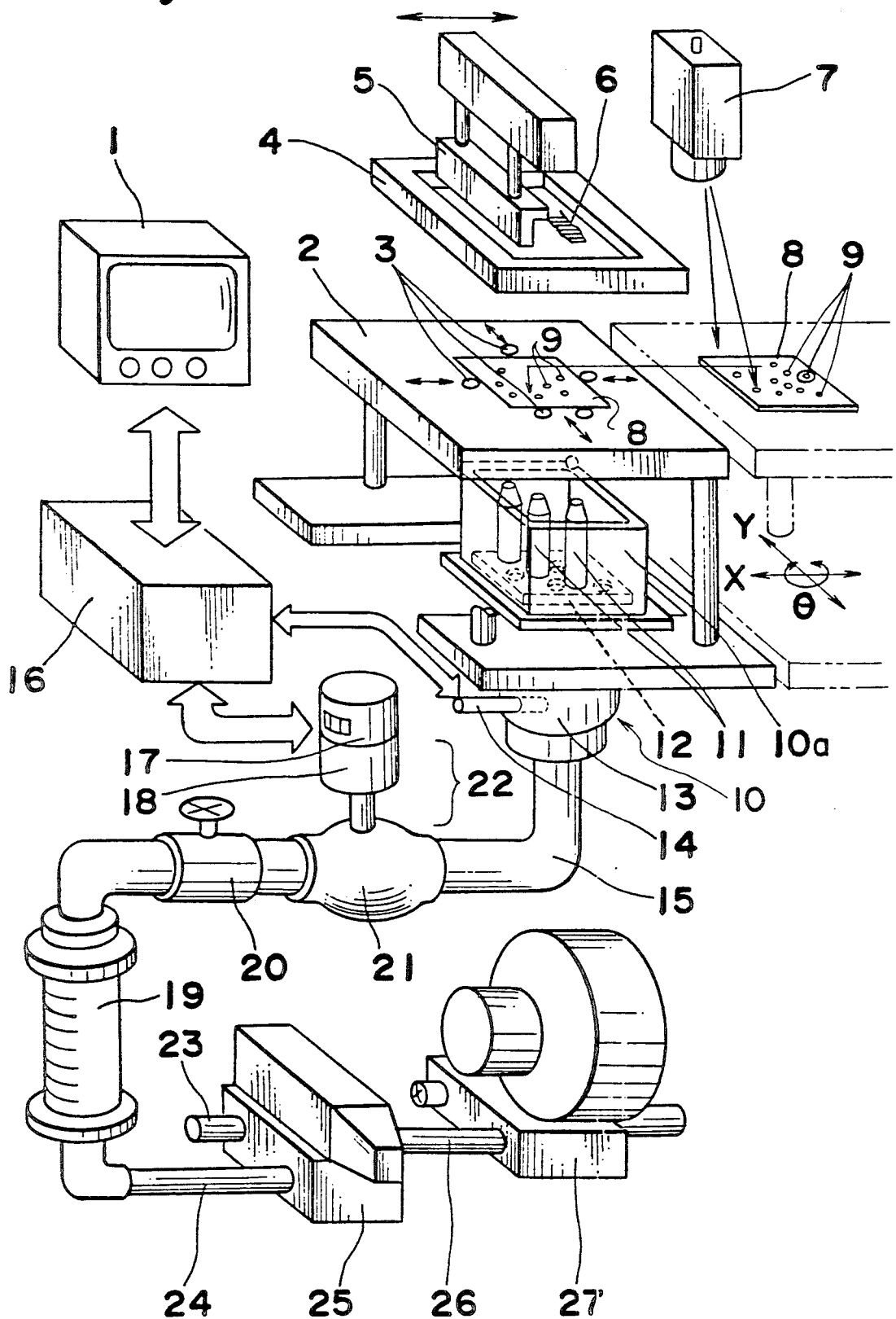
FIG. 1 is a perspective view showing the construction of a screen printing machine according to one embodiment of the present invention.

Before the description of the present invention proceeds, it is to be noted that like parts are designated by like reference numerals throughout the accompanying drawings.

FIG. 1 shows the construction of the screen printing machine according to one embodiment of the present invention. In FIG. 1, after the position of a substrate 8 is adjusted on a table 2 by a substrate adjusting means 3, the position of the substrate 8 and the positions and the sizes of through holes 9 formed in the substrate 8 are measured by a recognition camera 7 to accurately position the substrate 8 on the table 2. The table 2 is capable of being driven in each of the axial directions X, Y, and Z of a rectangular coordinate system and a rotary direction $\theta$ in the plane including the X and Y directions. Thus, the substrate 8 on the table 2 is accurately located under a screen plate 4. Thereafter, electric conductor paste 6 previously supplied onto the plate 4 is transmitted through the plate 4 to coat the surface of the substrate 8 and the inner surface of the through holes of the substrate 8 on the table 2 by moving a squeegee 5 capable of being driven by a drive source (not shown) under pressure on the plate 4. In order to perform a through hole printing to print the electric conductor paste 6 onto the surface of the substrate 8 and the inner surfaces of the through holes 9 formed at the substrate 8, it is necessary to exert suction on the substrate 8 through the through holes 9 and a suction unit 10 at the time of the coating of the paste 6 so that the paste 6 can be sufficiently coated on the inner surfaces of the through holes 9 formed in the substrate 8.

Figure 7:
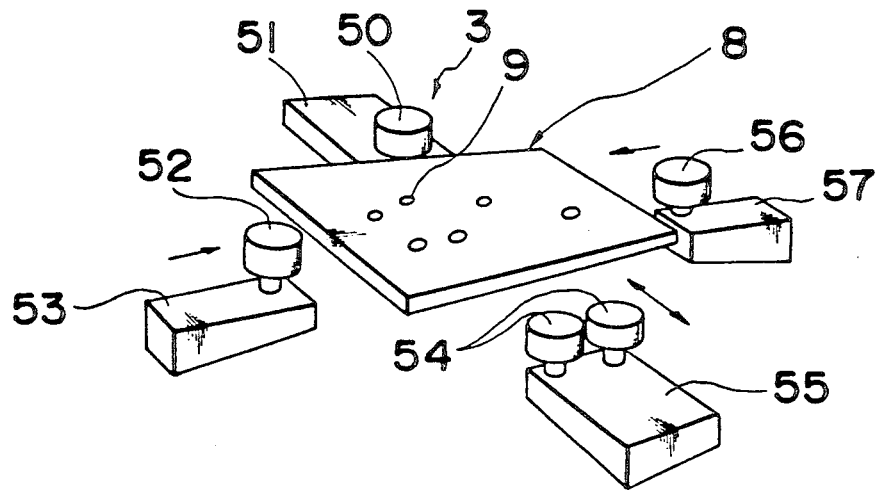
FIG. 7 is a perspective view showing the relation between a substrate and substrate adjusting members.
Figure 8:
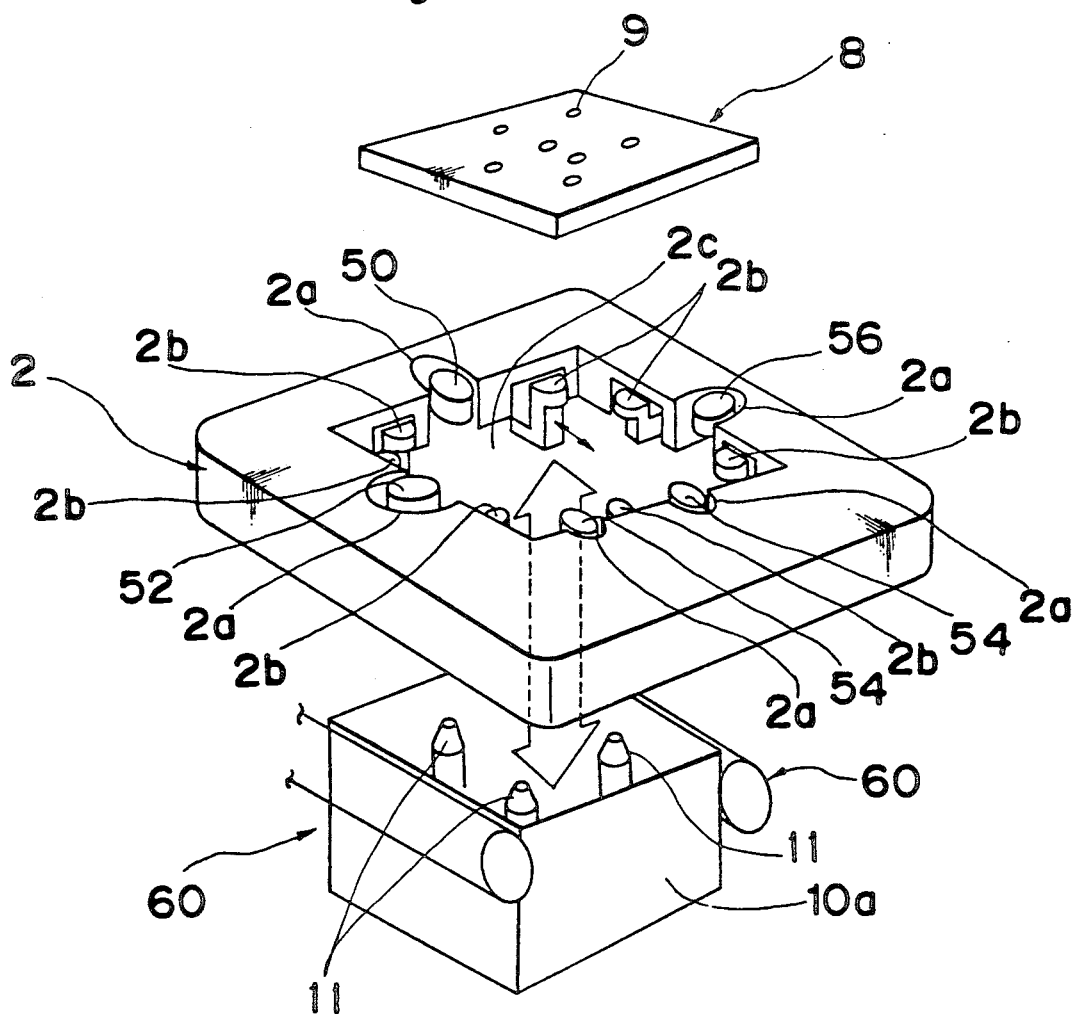
FIG. 8 is a perspective view showing the relation between the substrate, a table, and a suction member.
Figure 9:
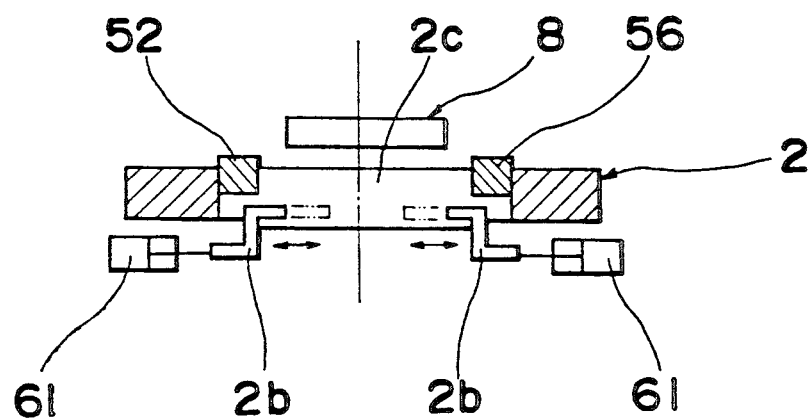
FIG. 9 is a cross-sectional view showing the table and the substrate adjusting members.

As shown in FIGS. 7, 8, and 9, the substrate adjusting means 3 comprises a first positioning member 50 driven by a cylinder 51, a second positioning member 52 driven by a cylinder 53, third positioning members 54 driven by a cylinder 55, and a fourth positioning member 56 driven by a cylinder 57. The positioning members 50, 52, 54, and 56 which are rollers made of resin move backward and forward in cutouts 2a formed at the periphery of a large center hole 2c of the table 2 to contact with or move away from the substrate 8 so as to adjust the position of the substrate 8. The substrate 8 is supported in the large hole 2c of the table 2 by supporting members 2b movable into the large hole 2c by cylinders 61.

Figure 10:
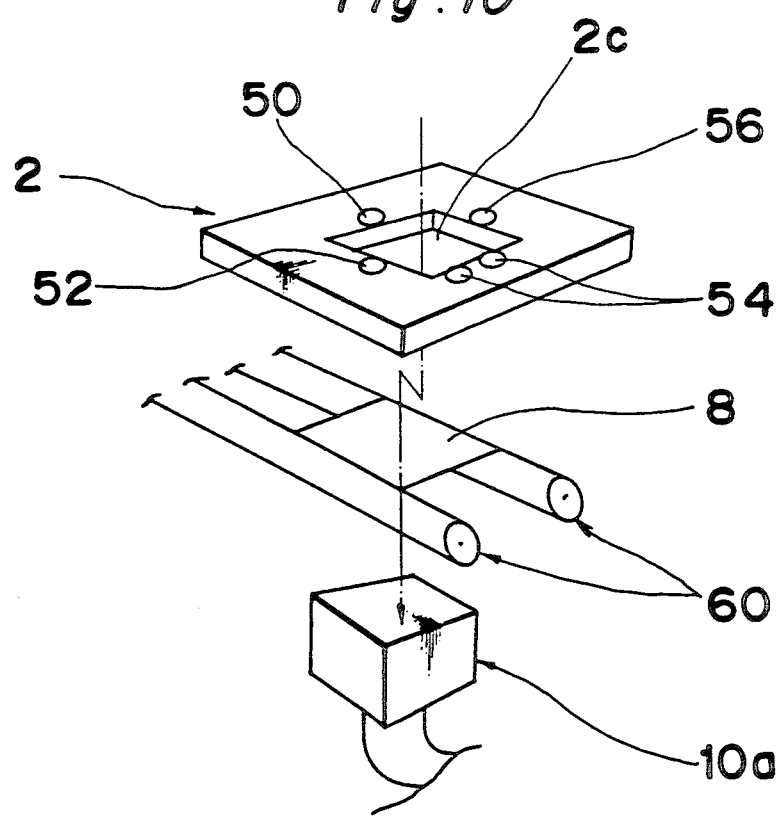
FIG. 10 is a perspective view showing a state where the substrate is discharged from the table.

The suction unit 10 is provided with a box-shaped suction member 10a arranged under the substrate 8, which is positioned relative to the table 2 while moving up and down to contact with or move away from the table 2, through the large hole 2c of the table 2 to connect with the through holes 9 of the substrate 8 arranged in the large hole 2c of the table 2. A degree of vacuum sensor 14 is arranged in the inner open portion 13 under the suction member 10a to measure the strength of the suction, three support pins 11 are arranged in the suction member 10a to prevent the warp of the substrate 8, a rectifying plate 12 is arranged in the suction member 10a to uniformly adjust the strength of the degree of vacuum, and pipes 15 and 26 are provided for connecting the portion 13 of the suction unit 10 with a blower 27, serving as a suction source for vacuum. A degree of vacuum adjusting valve 22, a manual throttle valve 20, a flow meter 19, and a changeover valve 25 for changing circuits 23 and 24 are arranged in the pipe 15. The adjusting valve 22 is provided with a throttle valve 21, a servomotor 18 for driving the valve 21 to open or close it, and an encoder 17 for detecting the rotary angle of the servomotor 18. Conveyor belts 60 are positioned on both sides of the suction member 10a. Thus, the substrate 8 supported by the supporting members 2b is held on the upper side of the suction member 10a after the supporting members 2b move away from the substrate 8 to move the substrate 8 downward on the upper side of the suction member 10a, and the substrate 8 is also put on the conveyor belts 60 by downward movement of the suction member 10a to transport the substrate 8 from under the table 2, as shown in FIG. 10.

A controller 16 is operated so as to calculate the most suitable suction condition by signals corresponding to the positions and the sizes of the through holes 9 measured by the camera 7, thus to send an opening or closing signal to the adjusting valve 22, and to simultaneously receive information from the sensor 14 arranged in the inner vacancy portion 13 of the suction unit 10, with the result that closed loop control is performed to send a correcting signal as necessary to the adjusting valve 22.

The blower 27 serving as a suction source for vacuum is normally operating to normally such air through the circuit 23 of the changeover valve 25. When the substrate 8 is put on the table 2 and then the positioning of the substrate 8 is completed by the substrate adjusting means 3, the printing is started and simultaneously the changeover valve 25 is changed to apply suction to the substrate 8 through the conduit 24, the pipe 15, and the through holes 9. Normally, the throttle valve 20 is fully opened. However, when it is not sufficient to adjust the degree of vacuum only by the adjusting valve 22, the throttle valve 20 is adjusted.

Figure 2:
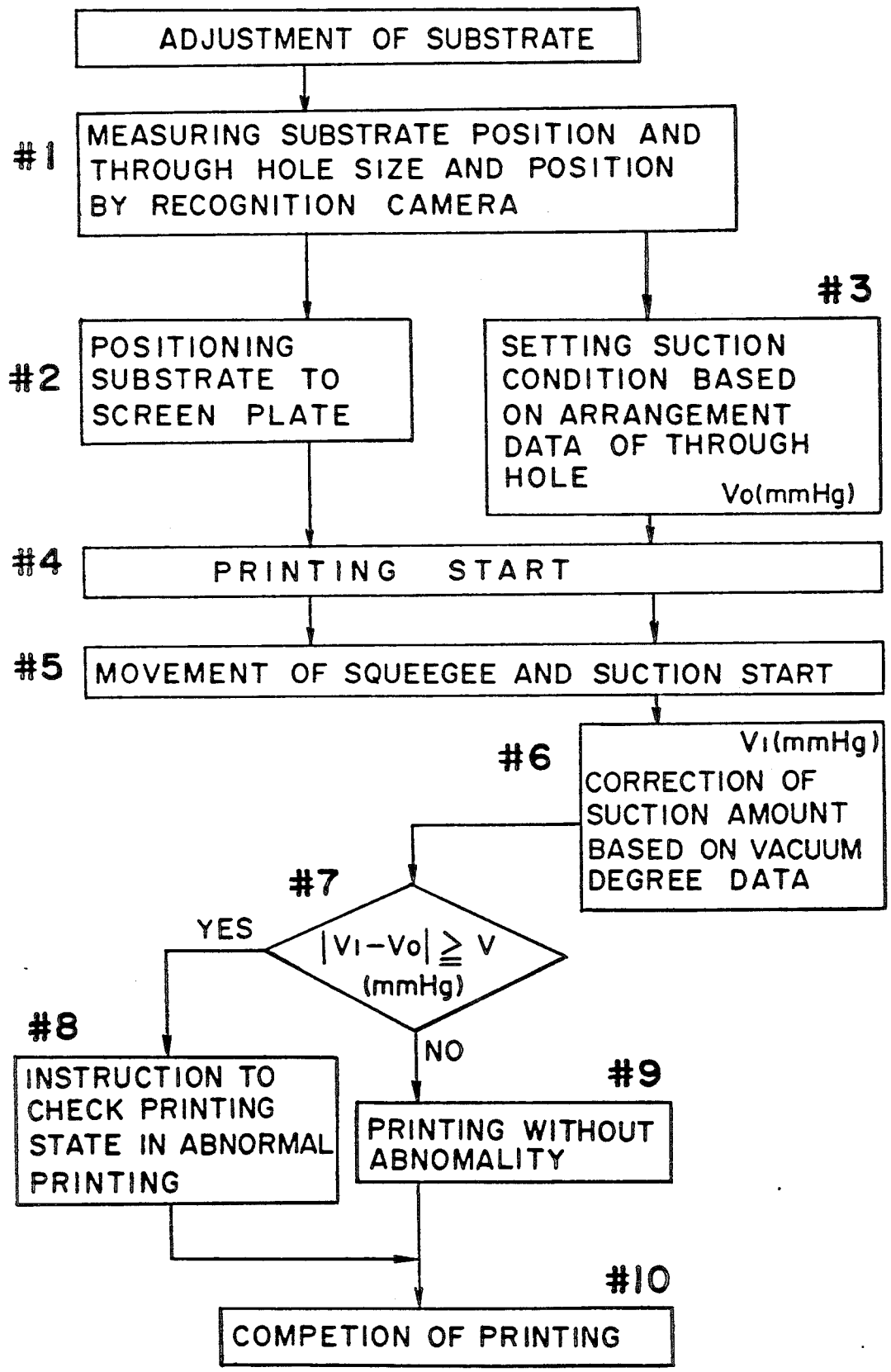
FIG. 2 is a flow chart showing the operational flow of the machine.

The flow of the printing operation of the machine is shown in FIG. 2.

Figure 3:
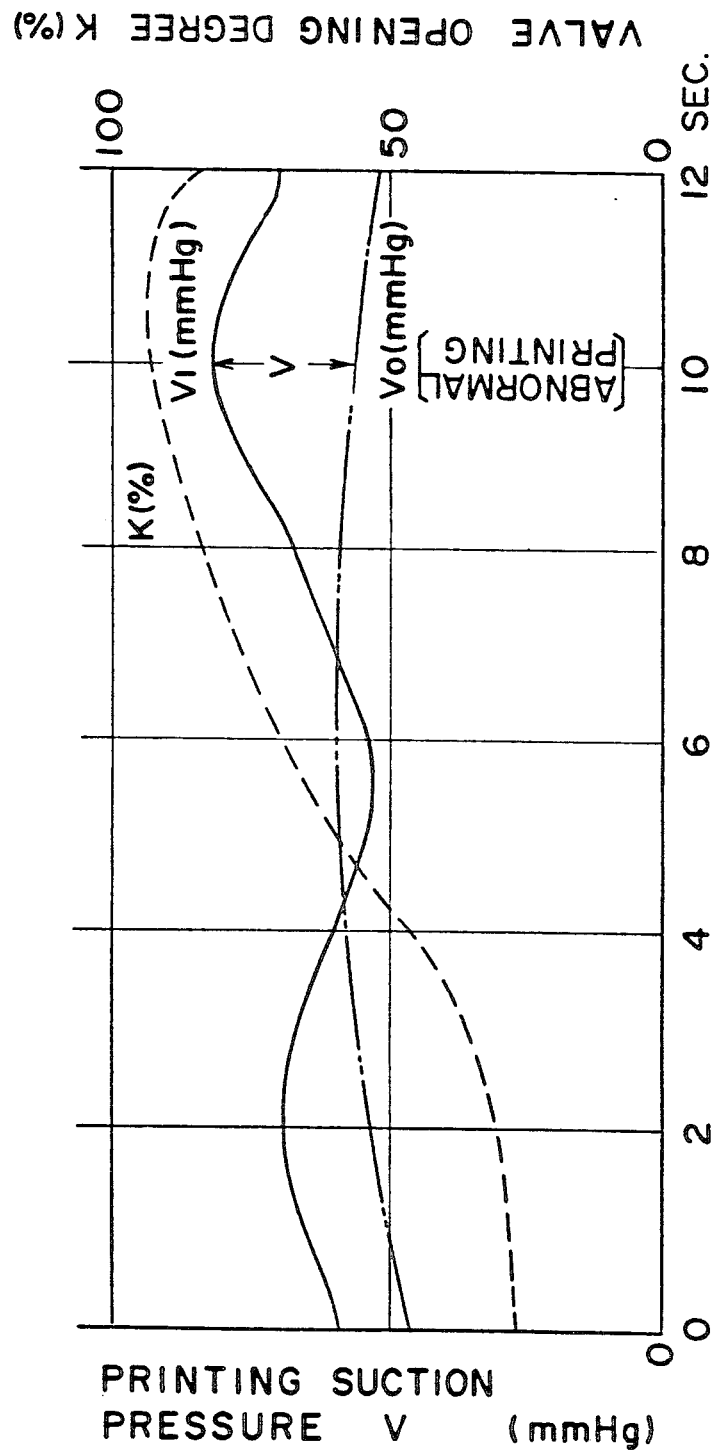
FIG. 3 is an explanatory view showing a monitor screen for displaying a suction state of the machine.
Figure 4:
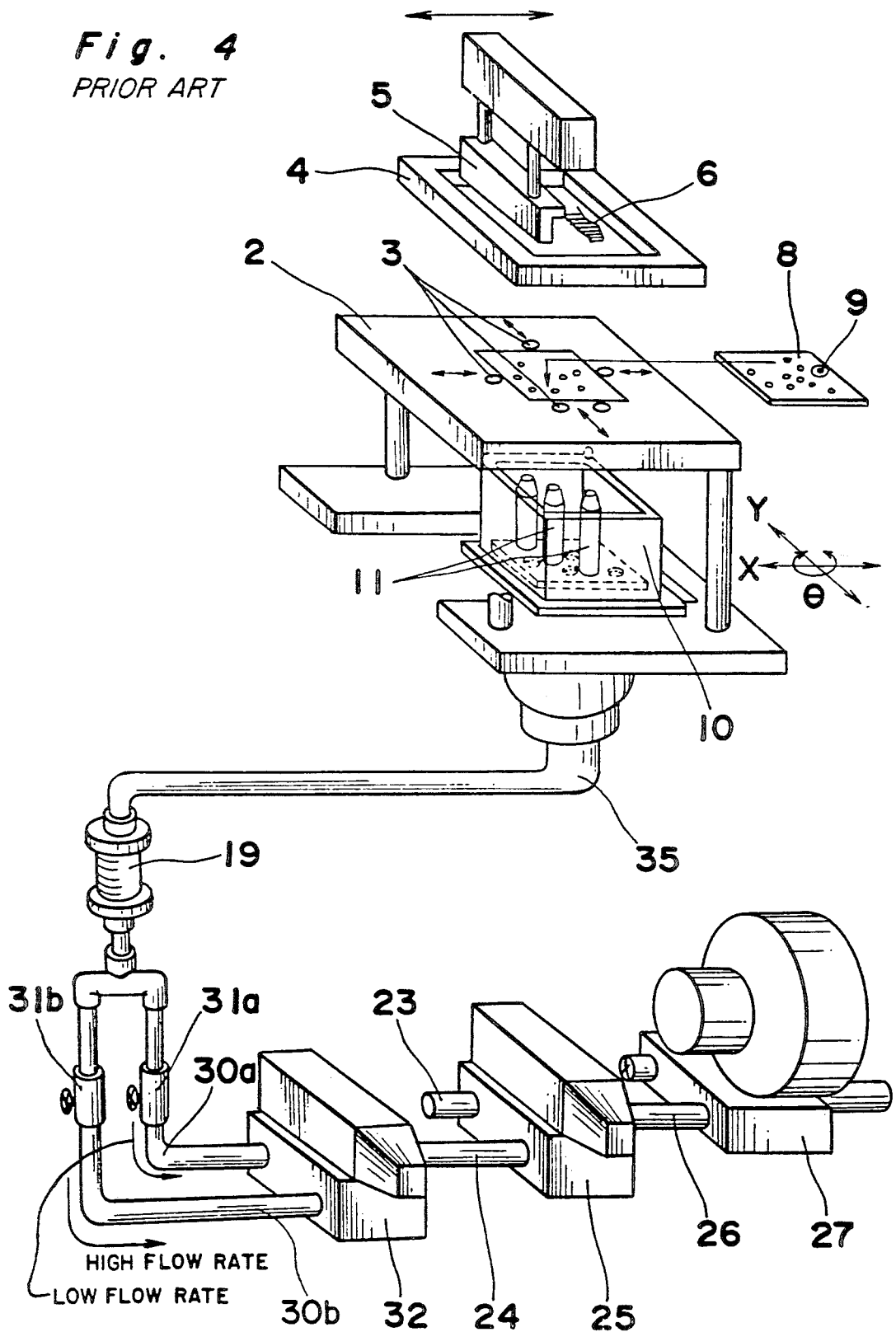
FIG. 4 is a perspective view showing the construction of a known screen printing machine.
Figure 6A:
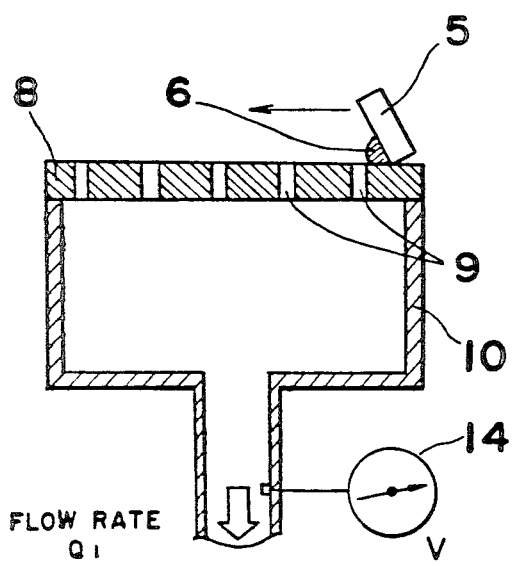
FIGS. 6A–6C are cross-sectional views showing states of the screen printing operation upon adjusting the suction flow rate.
Figure 6B:
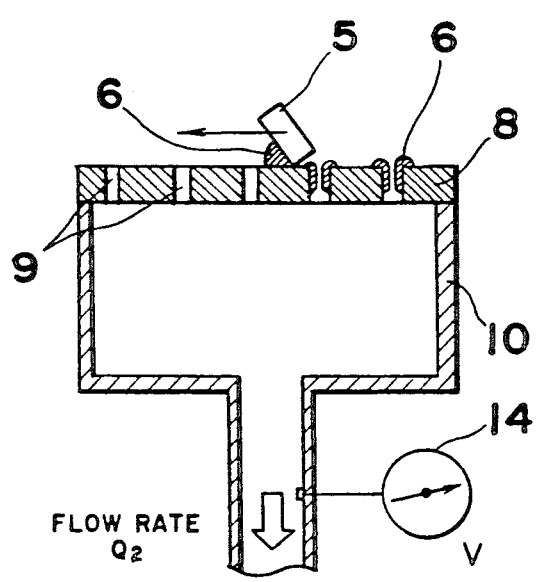
Figure 6C:
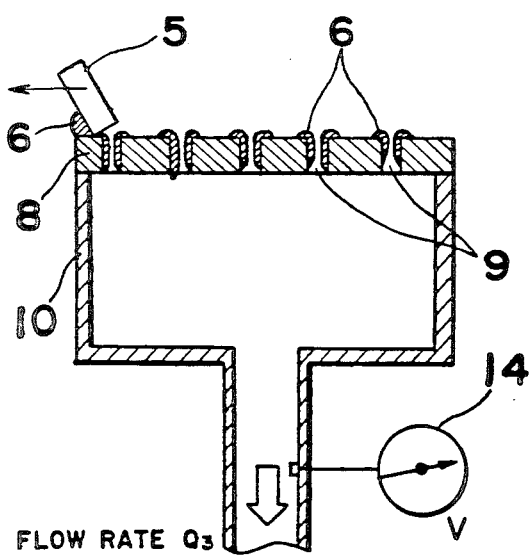
Figure 6D:
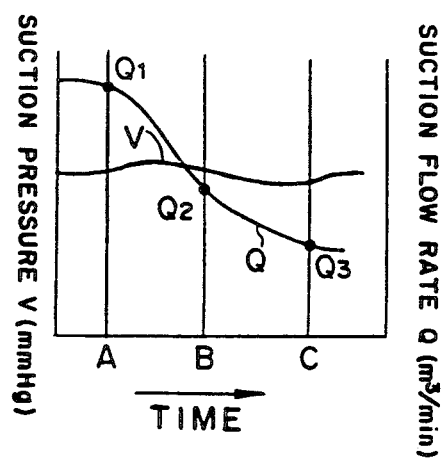
FIG. 6D is a view showing the correlation between the suction pressure and the suction flow rate.

Firstly, for adjustment of the substrate 8 with respect to the table 2, at step #1, the position of the substrate 8 and the positions and sizes of the through holes 9 are measured by the camera 7. At step #2, the substrate 8 is positioned on the table 2 with respect to the plate 4 by the adjusting means 3 as described above and is supported by the supporting members 2b in the large hole 2c of the table 2. At step #3, the controller 16 calculates and sets the most suitable pattern of gradual change of suction condition, as shown by the valve opening degree K of FIG. 3, on the basis of signals corresponding to the positions and the sizes of the through holes 9 measured by the camera 7. This is such as should produce a predetermined degree of vacuum $V_0$ in FIG. 3. Then, at step #4, the printing is started and the squeegee 5 moves on the plate 4 to transmit the paste 6 through the plate 4 and coat the surface of the substrate 8 on the table 2 with the paste 6 while the substrate 8 has suction applied thereto through the through holes 9 and the suction unit 10 by the blower 27 through the adjusting valve 22 opened according to the pattern. Then, at step #6, the controller 16 sends an opening or closing signal to the adjusting valve 22 based on the result of the calculation and simultaneously receives information from the sensor 14 arranged at the inner portion 13 of the suction unit 10, resulting in closed loop control to send a correcting signal as necessary to the adjusting valve 22. That is, the controller 16 makes a correction of the amount of suction based on the degree of vacuum measured by the sensor 14. At step #7, it is judged whether or not the difference between the degree of vacuum $V_1$ measured by the sensor 14 in the suction unit 10 and the predetermined degree of vacuum $V_0$ which should be present according to the degree of opening of the adjusting valve 22 as set by the controller 16 is a degree of vacuum V (mmHg) or more. When the degree of vacuum $V_1$ of the suction unit 10 differs from the predetermined degree of vacuum $V_0$ by the degree of vacuum V (mmHg) or more, as shown in FIG. 3, it is automatically judged at step #8 that the printing with respect to the substrate 8 has been abnormal. Thus, the controller 16 sends a signal to check the printing state. As shown in FIG. 3, a monitor 1 for displaying the operation conditions of the machine displays an opening degree of K percent of the adjusting valve 22 and simultaneously a time axis of degree of vacuum $V_1$ of the suction unit 10. Then, the printing is completed at step #10. On the other hand, at step #7, when the degree of vacuum $V_1$ of the suction unit 10 does not differ from the predetermined degree of vacuum $V_0$ by the degree of vacuum V (mmHg) or more, as shown in FIG. 3, it is judged that the printing has been performed without abnormality, and then the printing is completed at step #10. After the printing is completed, the supporting members 2b and the positioning members 50, 52, 54, and 56 move away from the substrate 8 to move the substrate 8 downward so that the substrate 8 is held on the upper side of the suction member 10a. Then, the suction member 10a moves downward to move away from the table 2, so that both the sides of the substrate 8 are supported by the conveyor belts 60 to transport the substrate 8 from under the table 2 as shown in FIG. 10.

According to the embodiment, the conditions for printing the electric conductor paste 6 onto the inner surface of the through holes 9 of the substrate 8 which momentarily changes can be controlled quantitatively. The operation of the machine can easily be made to correspond to the position, number, and size of the through holes 9 of the substrate 8 which differ in accordance with the type of the substrate.

In the embodiment, a vacuum pump can be employed as a suction source for vacuum instead of the blower 27. Also, the throttle valve 21 can be driven to open and close by a pulse motor instead of the servomotor 18.

Although the present invention has been fully described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims unless they depart therefrom.

What is claimed is:

1. A screen printing machine comprising:
 a table on which a substrate is to be put;
 a substrate adjusting means on said table for adjusting the position of a substrate on the table;
 a screen plate movable onto the table over a substrate;
 a squeegee movable on the plate for applying a paste to the substrate;

a suction system connected with said table for applying suction to a substrate and through holes in the substrate;

a degree of vacuum measuring means in the suction system for measuring the degree of vacuum in the suction system;

an adjusting means in the suction system downstream of said measuring means for adjusting the degree of vacuum in the system; and control means connected to said adjusting means for controlling the adjustment of said adjusting means for producing a predetermined pattern of gradual change of suction in said suction system which should produce a predetermined degree of vacuum, said pattern being according to the positions, number and sizes of holes in a substrate to which paste is being applied on said table.

2. A screen printing machine as claimed in claim 1 in which said control means is connected to said degree of vacuum measuring means and further comprises means for, when the degree of vacuum as measured is different from the predetermined degree of vacuum, actuating said adjusting means for causing said suction means to be adjusted to bring the degree of vacuum closer to the predetermined degree of vacuum.

3. A screen printing machine as claimed in claim 1 in which said adjusting means is a throttle valve and a servomotor connected to said throttle valve for opening and closing said throttle valve.

4. A screen printing machine as claimed in claim 1 in which said adjusting means is a throttle valve and a pulse motor connected to said throttle valve for opening and closing said throttle valve.

5. A screen printing machine as claimed in any one of claims 1-4 in which said control means further comprises means for comparing the degree of vacuum measured by said measuring means and comparing the measured degree of vacuum with the predetermined degree of vacuum, and when the difference exceeds a predetermined value, outputting a signal to indicate that the condition of the printed substrate may be abnormal.

6. A screen printing machine as claimed in claim 5 further comprising a recognition camera associated with said table for viewing a substrate to be printed and recognizing the position of the substrate relative to the table, and the positions, number and sizes of the through holes in the substrate, said recognition camera being connected to said control means, and said control means includes means for establishing said pattern of gradual change of suction according to the recognized characteristics of the substrate viewed by said recognition camera.

* * * * *